(12) United States Patent
Mauthe et al.

(10) Patent No.: US 11,011,377 B2
(45) Date of Patent: May 18, 2021

(54) METHOD FOR FABRICATING A SEMICONDUCTOR DEVICE

(71) Applicant: International Business Machines Corporation, Armonk, NY (US)

(72) Inventors: Svenja Mauthe, Zurich (CH);
Marilyne Sousa, Adliswil (CH);
Fabian Konemann, Zurich (CH);
Kirsten Emilie Moselund, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/375,255

(22) Filed: Apr. 4, 2019

(65) Prior Publication Data

US 2020/0321214 A1  Oct. 8, 2020

(51) Int. Cl.
*H01L 21/02* (2006.01)
*C30B 25/18* (2006.01)
*H01L 21/20* (2006.01)

(52) U.S. Cl.
CPC ........ *H01L 21/02647* (2013.01); *C30B 25/18* (2013.01); *H01L 21/02645* (2013.01); *H01L 21/2003* (2013.01)

(58) Field of Classification Search
CPC ......... H01L 21/02647; H01L 21/02645; H01L 21/0254; H01L 29/775; H01L 29/7853;
(Continued)

(56) References Cited

U.S. PATENT DOCUMENTS 7,880,189 B2   2/2011  Kittler et al.
9,620,360 B1*  4/2017  Borg ................ H01L 29/66795
(Continued)

FOREIGN PATENT DOCUMENTS

EP  2097934 B1  9/2009
WO  2007/138078 A1  12/2007
WO  2009/003848 A1  1/2009

OTHER PUBLICATIONS

Reiche, M., et al., "Electronic and Optical Properties of Dislocations in Silicon", Crystals 2016, Accepted Jun. 24, 2016, Published Jun. 30, 2016, 32 pages.
(Continued)

*Primary Examiner* — Thanh T Nguyen
(74) *Attorney, Agent, or Firm* — Scully, Scott, Murphy & Presser, P.C.; Daniel P. Morris

(57) ABSTRACT

A cavity structure comprises one or more seed surfaces, a first growth path for the growth of a first semiconductor structure from one of the one or more seed surfaces and a second growth path for the growth of a second semiconductor structure from one of the one or more seed surfaces. The cavity structure further comprises at least one opening for supplying precursor materials to the cavity structure. A method can include selectively growing the first semiconductor structure along the first growth path and selectively growing the second semiconductor structure along the second growth path. The first semiconductor structure has a first growth front and the second semiconductor structure has a second growth front. The method can further include merging the first and the second growth front at a border area of the first and the second semiconductor structure.

17 Claims, 11 Drawing Sheets

(58) Field of Classification Search
CPC ........... H01L 29/2003; H01L 21/02639; H01L 29/778; H01L 21/02587; H01L 29/06; H01L 21/0262; H01L 21/02642; H01L 21/02381; H01L 29/66462; H01L 21/02546; H01L 2029/7858; H01L 29/7786; C30B 25/18
See application file for complete search history.

(56) References Cited

U.S. PATENT DOCUMENTS

| | | |
|---|---|---|
| 10,074,536 B2 | 9/2018 | Lochtefeld |
| 2017/0040168 A1 | 2/2017 | Vincent et al. |
| 2017/0162671 A1 | 6/2017 | Basker et al. |
| 2018/0102430 A1 | 4/2018 | Lu |
| 2018/0269355 A1 | 9/2018 | Jain et al. |

OTHER PUBLICATIONS

Reiche, M.,. et al., "Single-electron transitions in one-dimensional native nanostructures", 27th International Conference on Low Temperature Physics (LT27), Journal of Physics: Conference Series 568, Dec. 2014, 6 pages.

Bologna, N., et al., "Stair-rod dislocation cores acting as one-dimensional charge channels in GaAs nanowires", Physical Review Materials 2, published Jan. 19, 2018, 014603-1-014603-6.

Choi, S., et al., SiGe epitaxial memory for neuromorphic computing with reproducible high performance based on engineered dislocations, Nature Materials, Apr. 2018, pp. 335-340, vol. 17.

* cited by examiner

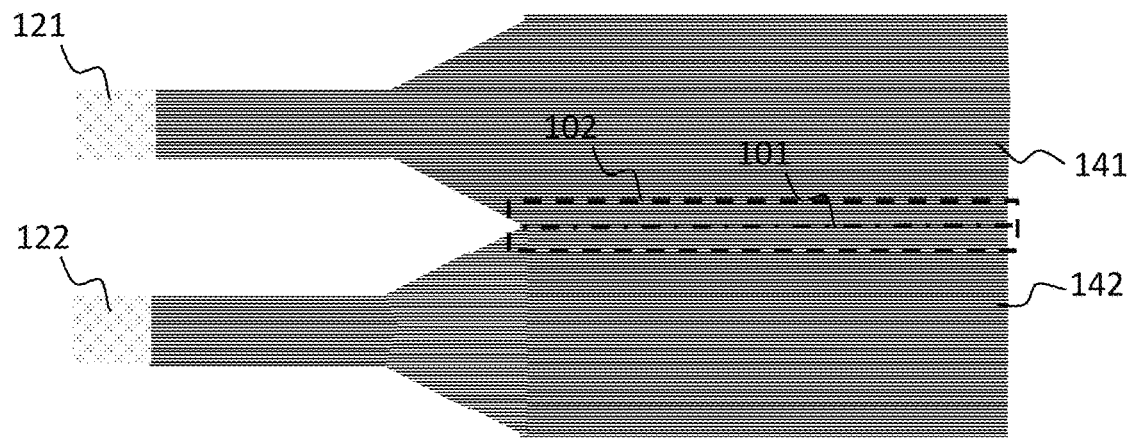
Figure 1e
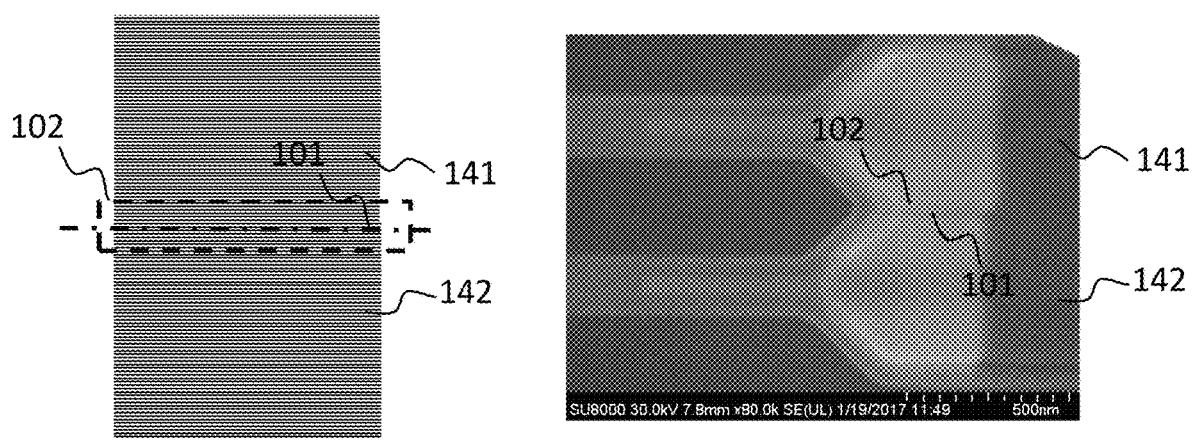
Figure 1f
Figure 1g

METHOD FOR FABRICATING A SEMICONDUCTOR DEVICE

BACKGROUND

The present disclosure relates to fabrication of semiconductor devices and provides methods for fabricating semiconductor devices on a substrate. The present disclosure relates also to semiconductor devices and semiconductor structures obtainable by such methods.

Semiconductor devices may comprise dislocations. Such a dislocation may be defined as a crystallographic defect or irregularity within a crystal structure of a semiconductor. The presence of dislocations may have a strong influence on many of the properties of the respective semiconductor device.

Dislocations cannot be controlled in established technologies and are usually considered as undesired defects, because they lead to stochastic spread in device characteristics.

SUMMARY

According to a first aspect, the invention is embodied as a method for fabricating a semiconductor device on a substrate. The method comprises steps of providing a substrate and providing a cavity structure on the substrate. The cavity structure comprises one or more seed surfaces, a first growth path for the growth of a first semiconductor structure from one of the one or more seed surfaces and a second growth path for the growth of a second semiconductor structure from one of the one or more seed surfaces. The cavity structure further comprises at least one opening for supplying precursor materials to the cavity structure. The method further comprises steps of selectively growing the first semiconductor structure along the first growth path and selectively growing the second semiconductor structure along the second growth path. The first semiconductor structure has a first growth front and the second semiconductor structure has a second growth front. The method comprises a further step of merging the first and the second growth front at a border area of the first and the second semiconductor structure. Thereby a defined dislocation region is grown at the border area, where the first and the second semiconductor structure merge.

Methods according to embodiments of the first aspect may facilitate an efficient and precise fabrication of dislocation regions in semiconductor devices in a defined way. This allows for using advantageous effects of such dislocations for the semiconductor device functionality in a predictable way.

According to methods of the first aspect, the cavity structure is used to determine and control the position of the dislocation region. More particularly, the cavity structure provides two separate growth paths, namely a first growth path and a second growth path. The first and the second growth path are arranged such that the growth fronts of the first and the second growth path merge during the growth process at a border area between the first and the second semiconductor structure. Methods according to embodiments of the invention control the fabrication of the dislocation regions by the geometry of the cavity structure. The dislocation position as well as the number of dislocations may be defined according to embodiments by the design and the geometry of the cavity structure.

Hence methods according to embodiments of the invention may allow the fabrication of semiconductor devices and structures that use specific properties of the dislocation regions in a predefined way for the functionality of the device.

According to embodiments, the dislocation region may have an enhanced mobility/conductivity along the dislocation.

According to embodiments, the dislocation region may involve a high strain level at the core of the dislocation region. This may cause significant changes of the band structure and may result in the formation of a quantum well along the dislocation region or a QD or quantum wire, depending on the geometry of the region.

Furthermore, there is evidence that dislocations do not freeze out but remain active at very low cryogenic temperatures (<4K). Hence embodiments of the invention may offer interesting device options for quantum computing applications.

Furthermore, devices according to embodiments of the invention may be optical devices. According to embodiments of the invention the controlled fabrication of dislocation regions in such optical devices may provide improved optical properties. As an example, a high degree of strain in the dislocation region may modify the bandgap locally, e.g. in quantum wells.

According to an embodiment, the one or more seed surfaces of the cavity structure comprise a first seed surface and a second seed surface. The second seed surface is spaced apart from the first seed surface. The method comprises steps of selectively growing from the first seed surface the first semiconductor structure and selectively growing from the second seed surface the second semiconductor structure. According to embodiments the growing of the first and the second seed structure is performed simultaneously.

Hence according to such embodiments, the first growth path and the second growth path start from separate seeds and the associated first and second semiconductor structure grow at first separately. Subsequently the first and the second growth path, in particular the first and the second growth front, are merged at the border area.

According to embodiments, the cavity structure comprises a first tapered edge portion adapted to extend the first growth path to the border area and a second tapered edge portion adapted to extend the second growth path to the border area. The first tapered edge portion and the second tapered edge portion converge at the dislocation region.

Such tapered edge portions facilitate the merging of the first growth front and the second growth front.

According to embodiments, the cavity structure comprises a third tapered edge portion adapted to further extend the first growth path of the cavity structure and a fourth tapered portion adapted to further extend the second growth path of the cavity structure.

Such tapered edge portions further facilitate the merging of the first growth front and the second growth front. In particular, the third tapered edge portion may be arranged symmetrical to the first tapered edge portion with respect to the first growth path and the fourth tapered edge portion may be arranged symmetrical to the second tapered edge portion with respect to the second growth path.

According to embodiments, the one or more seed surfaces are arranged with a predefined angle towards each other. According to embodiments the one or more seed surfaces may be arranged parallel to each other. According to other embodiments, the one or more seed surfaces may be arranged orthogonal to each other. According to other embodiments, the one or more seed surfaces may be inclined to each other.

According to an embodiment, the one or more seed surfaces of the cavity structure comprise a common or in other words a single seed surface for the first semiconductor structure and the second semiconductor structure. The cavity structure comprises a separation structure arranged in a separation area between the first growth path and the second growth path. The separation structure is adapted to separate the first and the second growth path. The separation structure may also be denoted as divergence structure or as perturbation structure. The cavity structure according to such an embodiment further comprises a merging area for merging the growth fronts of the first and the second semiconductor structure. The method according to such an embodiment comprises a first step of selectively growing from the common seed surface a common semiconductor structure. The method comprises a second step of selectively growing the first semiconductor structure and the second semiconductor structure along the separation structure. The separation structure separates the common semiconductor structure during a part of the growth process. Then the method comprises a third step of merging the first and the second growth front in the merging area of the cavity structure.

Hence according to such embodiments, the first growth path and the second growth path start initially from the common seed surface, are then subsequently separated by the separation structure and are finally merged in the merging area.

According to an embodiment the defined dislocation region establishes a dislocation plane.

Hence the defined dislocation region is in particular a 2-dimensional dislocation. The dislocation region may comprise in particular grain boundaries.

According to further embodiments, the cavity structure may provide three or more growth paths. This allows for growing a plurality of dislocation regions.

According to embodiments, the selective growing of the first semiconductor structure and the second semiconductor structure is performed by selective epitaxial growth.

According to embodiments, the selective growing of the first semiconductor structure and the second semiconductor structure is performed by metal organic chemical vapor deposition (MOCVD), atmospheric pressure CVD, low or reduced pressure CVD, ultra-high vacuum CVD, molecular beam epitaxy (MBE), atomic layer deposition (ALD) or hydride vapor phase epitaxy.

Such methods allow a precise control of the growing conditions of the first and the second semiconductor structure. Furthermore, they allow mass manufacturing.

According to embodiments each of the first and the second semiconductor structures may comprise a compound semiconductor material, in particular a group III-V compound material or a group II-VI compound material. This may allow advanced device functionalities.

According to embodiments the one or more seed surfaces may have in particular monocrystalline semiconductor surface to facilitate a directed growth. The seed surface may comprise in particular silicon to facilitate efficient device fabrication. According to embodiments, the substrate may be used as a seed surface.

Methods according to embodiments of the invention may comprise a further step of removing the cavity structure after the growth of the first and the second semiconductor structure. This may be performed, e.g., by etching.

According to some embodiments, the first growth path and the second growth path extend laterally over the substrate, while according to other embodiments the first growth path and the second growth path extend vertically to the substrate. The extension of the respective growth channels may be in particular chosen in dependence on the desired final structure and functionality of the semiconductor device.

According to embodiments, this may also be combined. As an example, according to embodiments a first sheet comprising a first semiconductor structure and a second semiconductor structure having a first dislocation region between them may be grown in a lateral direction in a first cavity structure. Then the first cavity structure may be removed, and a second cavity structure may be formed on top having vertical growth channels. Then a third semiconductor structure and a fourth semiconductor structure having a second dislocation region between them may be grown in a vertical direction in the second cavity structure.

According to another aspect of the invention a semiconductor device is provided that is obtainable by a method according to the first aspect.

Embodiments of the invention will be described in more detail below, by way of illustrative and non-limiting examples, with reference to the accompanying drawings.

BRIEF DESCRIPTION OF THE DRAWINGS

FIGS. 1a through 1f are schematic illustrations showing successive stages in a fabrication method embodying the invention;

FIG. 1g shows a SEM image of a semiconductor device structure that has been fabricated with a cavity structure according to an embodiment of the invention;

DETAILED DESCRIPTION

At first, some general aspects and terms of embodiments of the invention are described.

The term cavity structure may be defined as a hollow, partly filled or filled structure that is formed by a solid surrounding, e.g. surroundings walls. According to embodiments of the invention the cavity structure has one or more openings through which precursor materials can be supplied to the cavity structure. The cavity structure may be in particular adapted to confine and guide materials of a vapor phase epitaxial process from the one or more openings to one or more seed surfaces to initiate crystal growth.

The first and the second growth path may extend according to embodiments in a lateral direction extending laterally over a substrate. The term "laterally" is used in this context to indicate orientation generally parallel to the plane of the substrate, as opposed to generally vertically, or outwardly, from the substrate surface. According to other embodiments the first and the second growth path may extend in a direction that is vertically to the surface of the substrate.

FIGS. 1a through 1f show successive stages of a method for fabrication of semiconductor devices according to embodiments of the invention. FIGS. 1a through 1f are schematic top views.

Figure 1A:
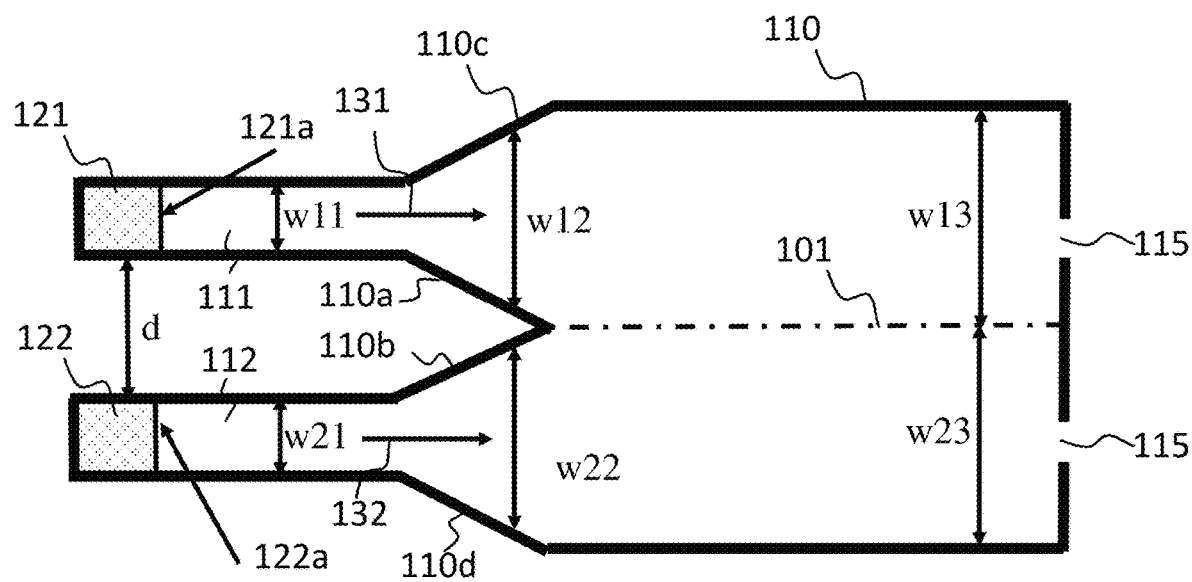

FIG. 1a is a schematic top view of a cavity structure 110 that comprises a first growth path 131 extending in a first direction and a second growth path 132 extending in a second direction. The cavity structure 110 comprises a first seed 121 having a first seed surface 121a and a second seed 122 having a second seed surface 122a. The second seed 121 and the second seed surface 121a are spaced apart from the second seed 122 and the second seed surface 122a by a lateral distance d. The distance d may be chosen e.g. in a range between 100 nm and 30 nm.

The cavity structure 110 comprises a first growth channel 111 for the first growth path 131. According to this embodiment, the first growth channel 111 comprises a first part with a fixed width w11, a second part with an increasing width w12 and a third part with a fixed width w13.

The cavity structure 110 comprises a second growth channel 112 for the second growth path 132. According to this embodiment, the second growth channel 112 comprises a first part with a fixed width w21, a second part with an increasing width w22 and a third part with a fixed width w23.

The cavity structure 110 comprises a first tapered edge portion 110a adapted to extend the first growth path 131 to a border area 101 and a second tapered edge portion 110b adapted to extend the second growth path 132 to the border area 101. The border area 110 is an area at which the first growth channel 111 and the second growth channel 112 adjoin. The first tapered edge portion 110a and the second tapered edge portion 110b converge at the border area 101. The border area 101 is illustrated by a dash-dot line.

The cavity structure 110 furthermore comprises a third tapered edge portion 110c adapted to extend the first growth path 131 and a fourth tapered edge portion 110d adapted to extend the second growth path 132. The third tapered edge portion 110c is arranged symmetrical to the first tapered edge portion 110a with respect to the first growth path 131 and the fourth tapered edge portion 110d is arranged symmetrical to the second tapered edge portion 110b with respect to the second growth path 132.

The first seed 121 provides a seed for growing a first semiconductor structure 141 selectively from the first seed surface 121a and the second seed 122 provides a seed for selectively growing from the second seed surface 122a a second semiconductor structure 142 (see FIGS. 1b to 1f)

The cavity structure 110 comprises schematically illustrated openings 115 for supplying precursor materials to the cavity structure 110.

The first seed surface 121a and the second seed surface 122a are substantially perpendicular to the first growth path 131 and the second growth path 132 respectively.

The selective growing of the first semiconductor structure 141 and the second semiconductor structure 142 may be performed in particular by selective epitaxial growth. Methods that are in particular suitable according to embodiments are metal organic chemical vapor deposition (MOCVD), atmospheric pressure CVD, low or reduced pressure CVD, ultra-high vacuum CVD, molecular beam epitaxy (MBE), atomic layer deposition (ALD) and hydride vapor phase epitaxy.

The first seed surface 121a and the second seed surface 122a may have in particular an area of order $10^4$ nm$^2$ or less, to ensure a single point of nucleation. The first seed surface 121a and the second seed surface 122a may be embodied as monocrystalline semiconductor surfaces, in particular of silicon.

Figure 1B:
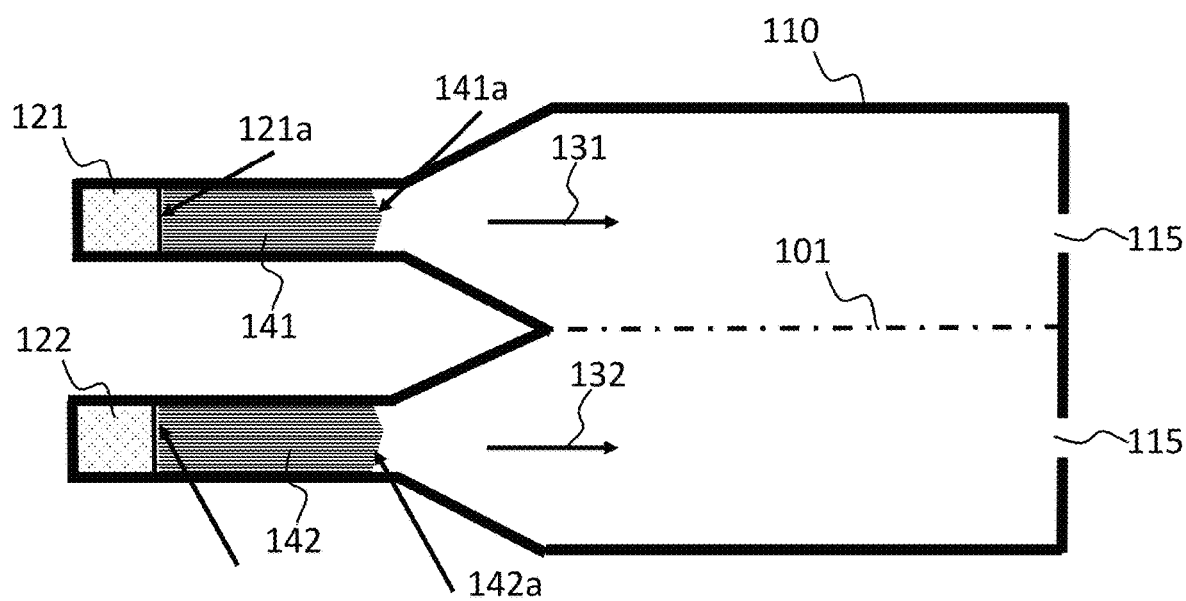
Figure 1C:
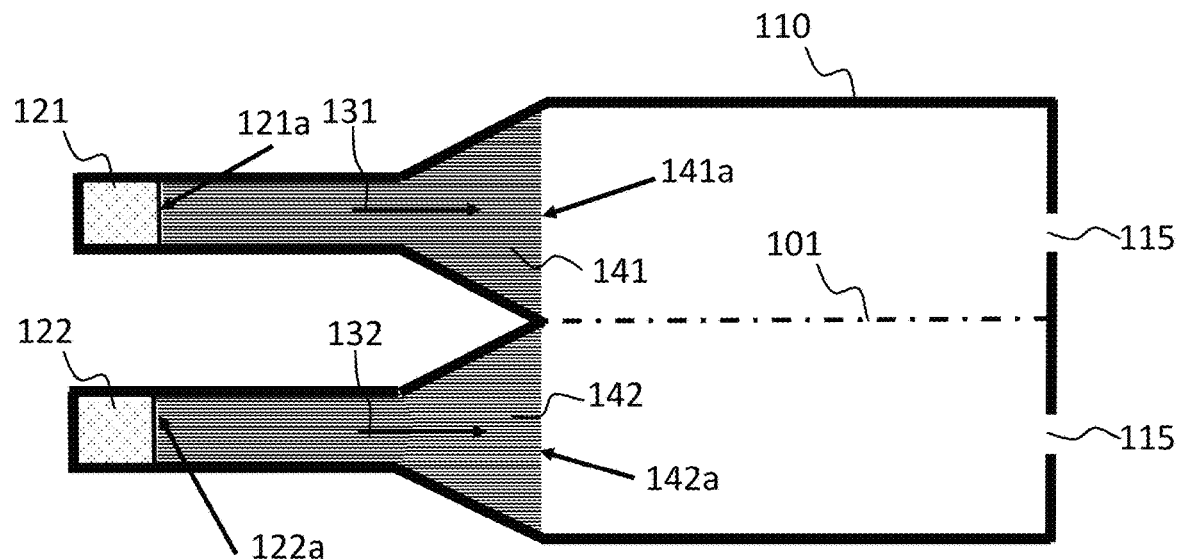
Figure 1D:
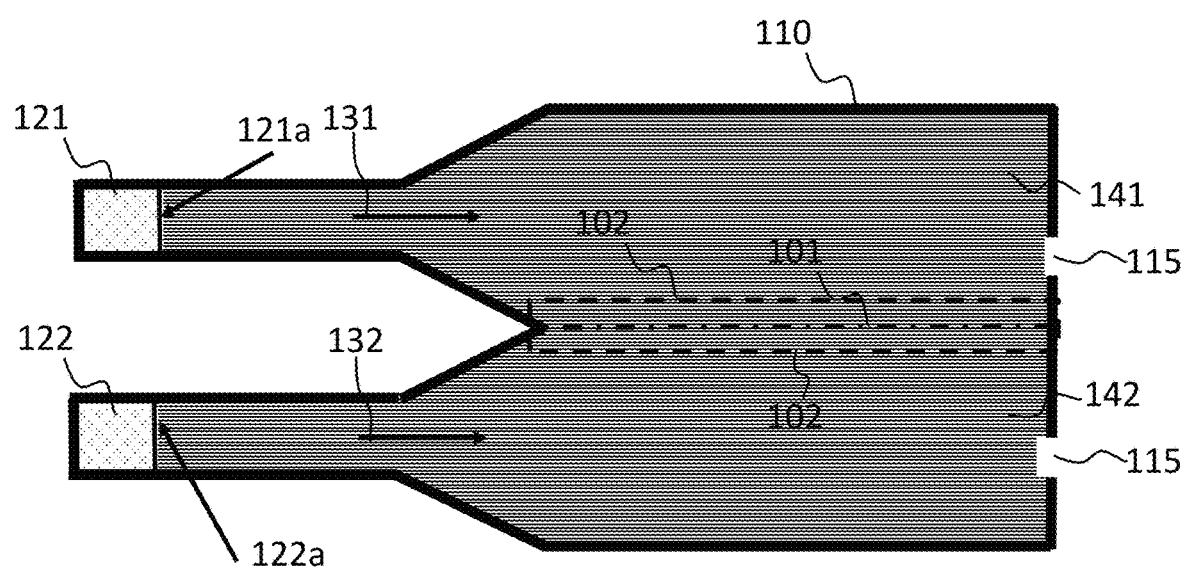

FIGS. 1b to 1d illustrate different stages of the growth process of the first semiconductor structure and the second semiconductor structure.

In FIG. 1b the first semiconductor structure 141 and the second semiconductor structure 142 have been grown in the first part of the first channel 111 and the second channel 112 respectively. During the selective growth the first semiconductor structure 141 has a first growth front 141a and the second semiconductor structure 142 has a second growth front 142a.

In FIG. 1c the first semiconductor structure 141 and the second semiconductor structure 142 have been grown in the second part of the first channel 111 and the second channel 112 respectively along the tapered edge portions. Hence the width w12 and w22 of the first semiconductor structure 141 and the second semiconductor structure 142 has increased along the tapered edge portions and, at the end of the tapered edge portions, the growth front 141a of the first semiconductor structure 141 and the growth front 142a of the second semiconductor structure 142 have started to merge.

FIG. 1d shows the first semiconductor structure 141 and the second semiconductor structure 142 after the selective growth has been finished. During the growth in the third part of the channel the first growth front 141a and the second growth front 142a of the first semiconductor structure 141 and the second semiconductor structure 142 respectively have been merged at the border area 101 between the first and the second semiconductor structure. Thereby a defined dislocation region 102 has been grown at the border area 101 and/or around the border area 101. The defined dislocation region 102 is indicated by a dashed rectangle.

In general, the first and the second semiconductor structures may comprise any desired semiconductor materials. In preferred embodiments the first semiconductor structure and the second semiconductor structure comprise a compound semiconductor material. A compound semiconductor material includes a III-V compound semiconductor material, a II-VI compound semiconductor material and/or a IV-IV compound semiconductor material. In particular, indium gallium arsenide, indium arsenide and/or gallium arsenide may be used in view of a higher carrier mobility than silicon, thereby allowing high-frequency semiconductor devices.

According to embodiments, material composition and/or dopant levels may be varied during the growth processes if desired.

Referring now to FIG. 1e, a semiconductor device is shown for which the cavity structure 101 has been removed, e.g. by etching.

Then, in another fabrication step, the result of which is illustrated in FIG. 1f, any desired part of the semiconductor structure may be removed, e.g. by etching.

The semiconductor device shown in FIG. 1f comprises the first semiconductor structure 141 on top, the second semiconductor structure 142 in the bottom and between these two structures the defined dislocation region 102.

According to embodiments the semiconductor device shown in FIG. 1f may then be further processed in any desired way, e.g. by providing contacts or by embedding the device in further semiconductor structures.

FIG. 1g shows a SEM image of an $In_xGa_{1-x}As$ semiconductor device structure nucleated from a silicon seed that has been fabricated within a $SiO_2$ cavity structure similar to the one schematically illustrated with reference to FIGS. 1a to 1d. This image demonstrates successful formation of a dislocation region 102 at the border area 101 between the first semiconductor structure 141 and the second semiconductor structure 142.

Hence methods according to embodiments of the invention may facilitate the fabrication of semiconductor devices having dislocations at predefined areas of the semiconductor device in a predefined and desired way.

An exemplary fabrication method of the cavity structure will now be described in more detail with reference to FIGS. 2a through 2g.

Figure 2A:
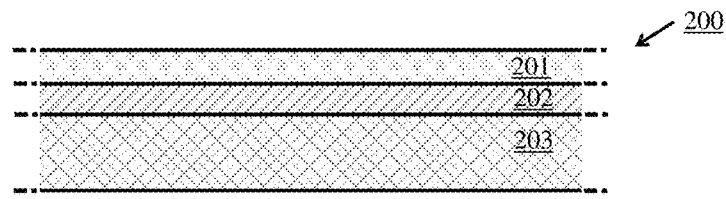
FIGS. 2a through 2g are schematic illustrations showing more detailed stages in a fabrication method of a cavity structure embodying the invention.

FIG. 2a is a schematic cross-section through a SOI (Silicon On Insulator) wafer 200 which provides the substrate for this fabrication process. Wafer 200 comprises three layers. A thin, typically 10-200 nm thick, Si device layer 201 is bonded or deposited on a silicon oxide dielectric layer 202 (25 nm-2 μm thick) which in turn overlies a thick silicon handle wafer 203. The Si device layer 201 may have a (100) surface orientation and provides a seed material layer for the one or more seed surfaces of the fabrication method.

Figure 2B:
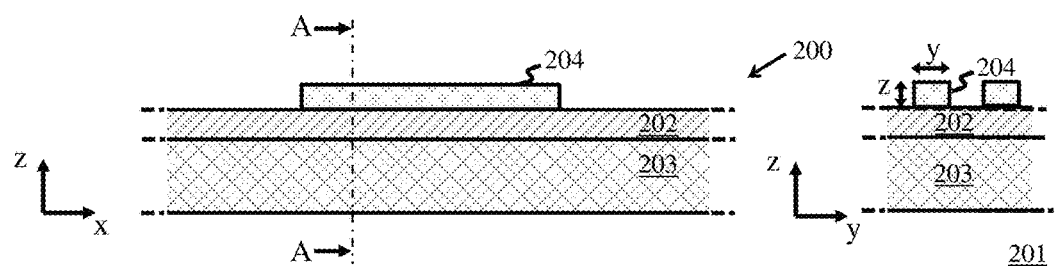

In a first step of the method the Si layer 201 is patterned to form a silicon structure 204 as shown in FIG. 2b. The structure 204 defines the interior of the cavity structure for the first and the second growth path of the first and the second semiconductor structure to be formed. The structure 204 may also provide the basis for the one or more seeds for the growth of the first semiconductor structure and the second semiconductor structure to be formed in subsequent steps. This initial patterning step exposes the dielectric layer 202 around structure 204 and may involve reducing the thickness of device layer 201 according to the desired dimensions of the first growth path and the second growth path and the corresponding first growth channel and the second growth channel to be formed.

The resulting structure 204 of a seed material for the one or more seeds first thus projects from dielectric layer 202.

In this example, the structure 204 has a U-shaped form corresponding to e.g. the U-shaped form of the cavity structure 110 as illustrated in FIGS. 1a to 1d.

FIG. 2b shows on the left-hand side a cross sectional view in the x-z-plane and illustrates on the right-hand side a schematic cross-section on A-A of the left-hand view in the figure. The right hand cross-sectional view is taken along the first part of the growth channel and accordingly comprises two separated structures for the growth channels including the first and the second seed to be formed.

Each of dimensions y, z in this example may be according to embodiments between 200 nm and 10 nm. However, generally any other shapes and dimensions may be used as desired.

In a second step of the fabrication process of the cavity structure, a second dielectric layer 205, e.g. of silicon oxide, is deposited over, and in contact with, the structure 204 and the first dielectric layer 202. The result of this step is illustrated in FIG. 2c, where the right-hand view shows a cross-section on B-B of the left-hand view in the figure.

Figure 2C:
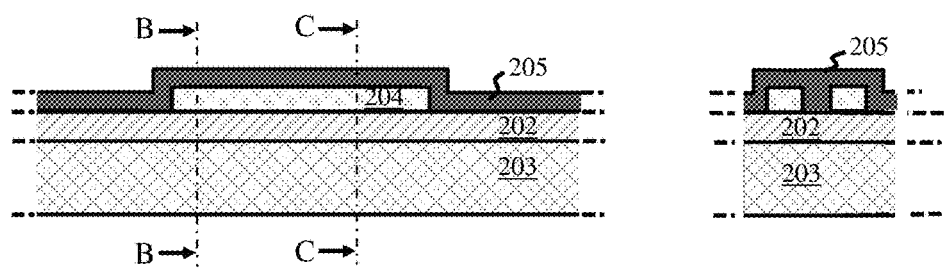
Figure 2D:
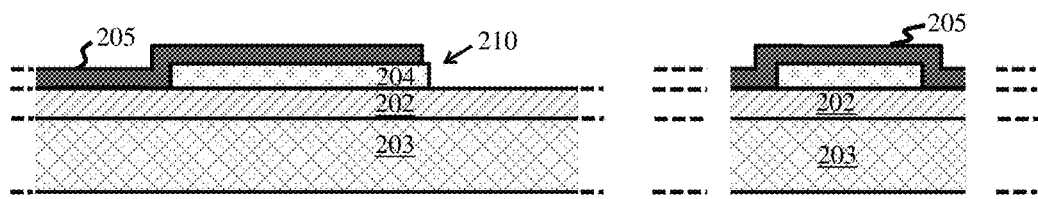
Figure 2E:
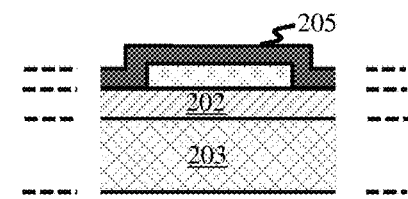
Figure 2F:
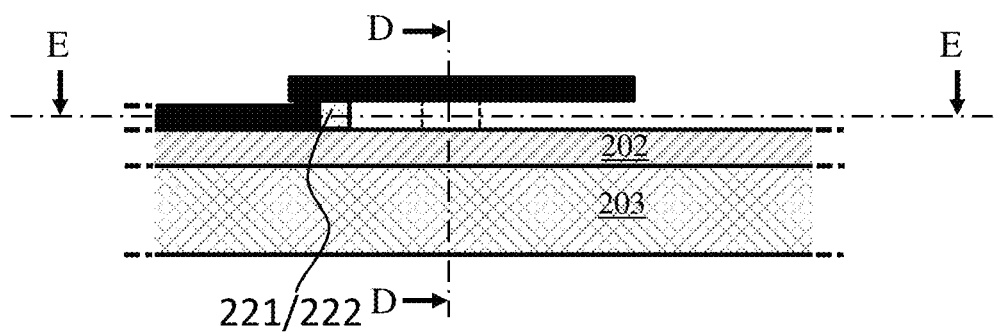
Figure 2G:
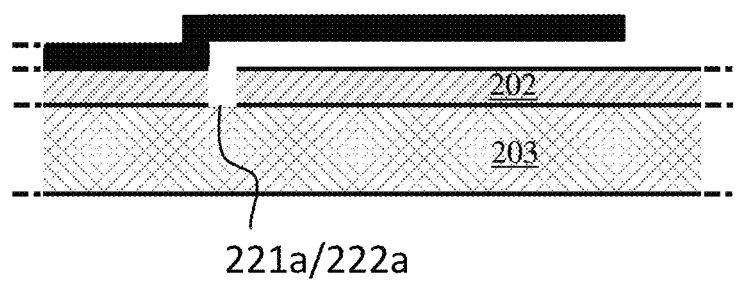

FIG. 2e shows a cross-section on C-C of the left-hand view of FIG. 2c to illustrate the wider third part of the growth channel Next, as illustrated in FIG. 2d, an opening 210 is formed in the cavity structure, e.g. by lithographic processing, to expose the structure 204. A first portion of the structure 204 is then etched away via the opening 210, e.g. by $XeF_2$ vapor, etching, or wet-etching in a suitable etchant such as TMAH or KOH. This stage is illustrated in FIG. 2f. The remaining portion of structure 204 provides a first seed 221 and a second seed 222 for subsequent growth of the first and the second semiconductor structure. The surface orientation of the seed surfaces of the first seed 221 and the second seed 222 can be well tailored by choosing the crystal orientation of the seed material and the wet etchant. If the surface orientation of the seed material is along (110), vertical (111) seed surfaces can be obtained, while for more common (100) surface orientation the (111) seed surface will be inclined. The seed surface of the first seed 221 and the second seed 222 may have a limited seed surface area of order $10^4$ nm$^2$ or less to facilitate initially a single nucleation point of the first and the second semiconductor structure.

The first and second dielectric layers 202, 205 together form a cavity structure with a first growth path and a second growth path corresponding to the cavity structure 110 of FIG. 1. According to this example, the first growth path and the second growth path extend laterally over the substrate 203.

In other methods embodying the invention, the cavity structure can be formed by any convenient processing techniques on a substrate. As an example, the substrate 203 may be used as seed surface for growing the first semiconductor structure and the second semiconductor structure. Such an example is illustrated in FIG. 2h. As can be seen, the dielectric layer 202 comprises openings with one end reaching the surface of the substrate 203 and the other end reaching the cavity structure. Thereby the first seed and the second seed may be provided by the substrate 203 with a seed surface 221a, 222a. According to such an embodiment the first semiconductor structure and the second semiconductor structure start growing from the substrate 203 initially in a vertical direction and then the growing of the first semiconductor structure and the second semiconductor structure proceed laterally.

Prior to the selective growth step, the Si seed surface is preferably cleaned, by flushing with an HF dip, to remove any surface oxidation, or by another surface cleaning method such as thermal desorption.

According to embodiments, the substrate may be any suitable substrate and may be embodied e.g. as a Si-substrate, a SIM wafer, a GaAs-substrate, an InP-substrate, a SiC-substrate or a GaN-substrate.

While the seed surfaces may be a monocrystalline semiconductor surfaces, this is not essential. In particular for embodiments where the area of the seed surface is constrained, the seed surface may be provided by a surface of an amorphous or polycrystalline semiconductor or a metal or a metal-semiconductor alloy such as a metal silicide.

After formation of the first and the second semiconductor structure, the cavity structure may be removed as desired, e.g. by etching. The structure may then be further optimized, e.g. to refine shape, and subsequent device processing steps may be performed as appropriate to build a required device structure around the first and the second semiconductor structure.

The basic fabrication steps described above can be performed using well-known material processing techniques.

By way of illustration, details of an exemplary process for fabricating the structure as shown in FIG. 1g comprising first and second semiconductor structures of $In_xGa_{1-x}As$ on an SOI wafer are described in the following. An SOI wafer with a roughly 60 nm device layer was processed to form the structure 204 of FIG. 2b by electron beam lithography and reactive ion etching. A dielectric layer 205 of SiO2 was deposited to a thickness of 100 nm by plasma-enhanced chemical vapor deposition. Opening 210 was formed by electron beam lithography and the seed material was partially removed by a tetramethylammonium hydroxide wet etch to leave the first and the second seed 221/222a as shown in FIG. 2f. The first semiconductor and the second semiconductor structures of $In_xGa_{1-x}As$ were then grown by MOCVD using the precursors TMIn, TMGa and TBAs at a temperature of around 550° C. This produced the first and the second semiconductor structure in a single growth run.

Figure 3A:
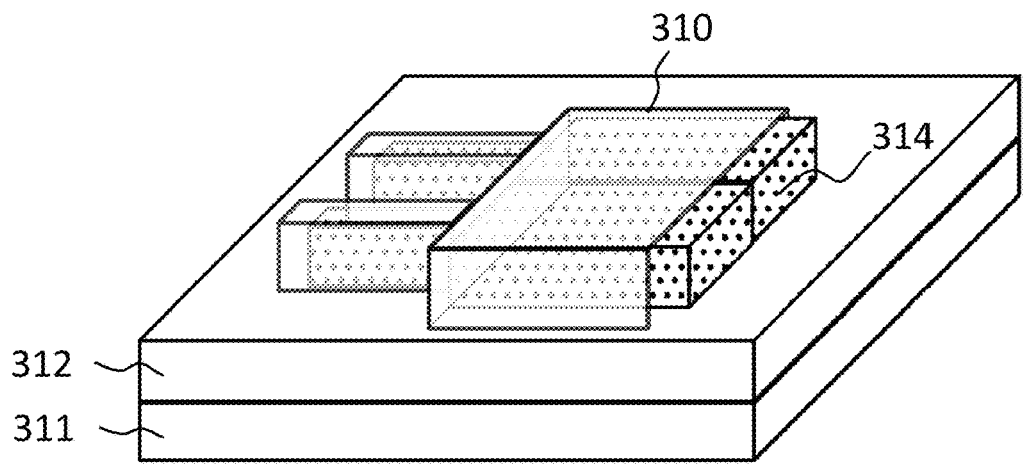
FIGS. 3a through 3c show successive stages of a method for the fabrication of semiconductor devices according to embodiments of the invention.
Figure 3B:
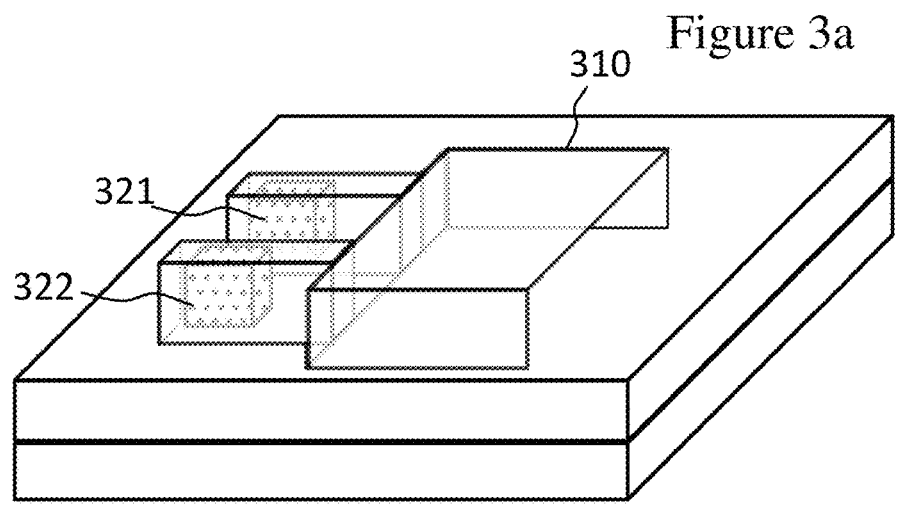
Figure 3C:
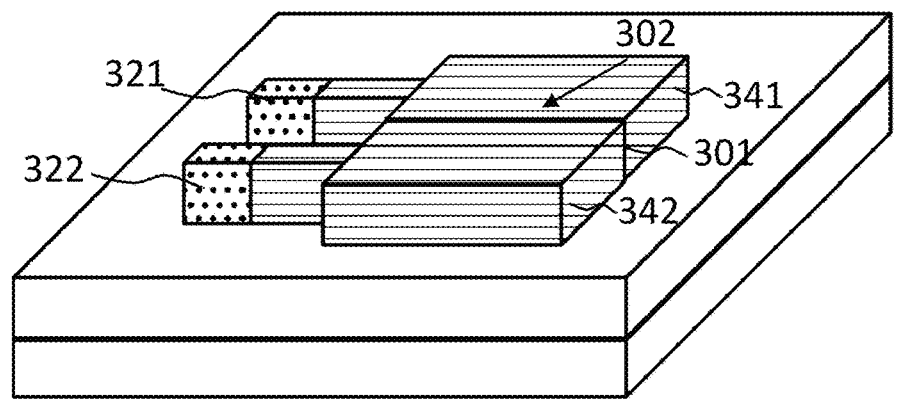

FIG. 3a through 3c show schematic 3-dimensional views of successive stages of a method for the fabrication of semiconductor devices according to embodiments of the invention.

In FIG. 3a a structure 314 of silicon has been formed on a Si-wafer 311 with a box layer 312 on top. The structure 314 is covered with a cavity layer 310 of SiOx.

In FIG. 3b the structure 314 has been partly removed by etching, thereby forming a cavity comprising a first Si-seed 321 and a second Si-seed 322.

In FIG. 3 a first semiconductor structure 341 and a second semiconductor structure 342 have been grown in the cavity structure 310. The first and the second semiconductor structures comprises a defined dislocation region 302 at the border area 301 between the first and the second semiconductor structures.

Figure 4A:
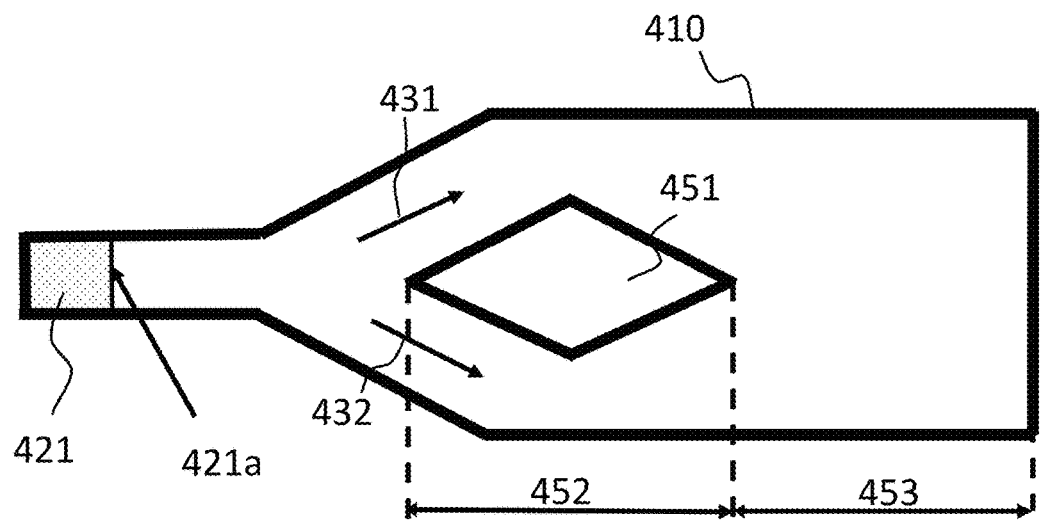
FIG. 4a and FIG. 4b show successive stages of a method for fabrication of semiconductor devices according to embodiments of the invention.
Figure 4B:
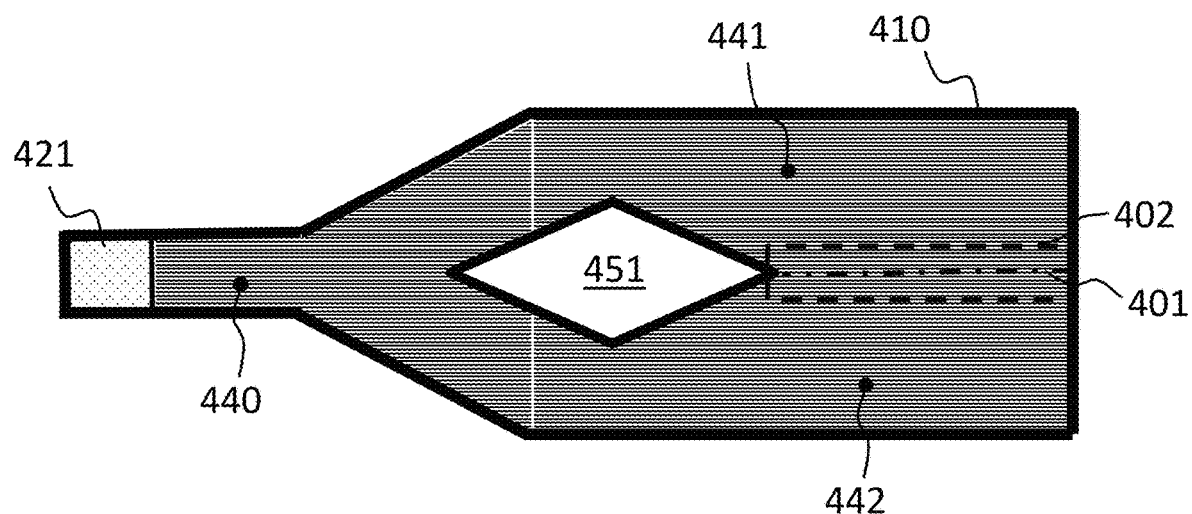

FIG. 4a and FIG. 4b show successive stages of a method for fabrication of semiconductor devices according to embodiments of the invention.

FIG. 4a is a schematic top view of a cavity structure 410 that comprises a first growth path 431 extending in a first direction and a second growth path 432 extending in a second direction. The cavity structure 410 comprises a common seed surface 421a which is initially and commonly used for the growth of a first and a second semiconductor structure. The common seed surface 421a may also be denoted as single seed surface. The cavity structure 410 comprises a separation structure 451 which is arranged in a separation area 452 between the first growth path 431 and the second growth path 432. The separation structure 451 may also be denoted as divergence structure or as perturbation structure. The cavity structure 410 comprises a merging area 453 for merging the growth fronts of the first and the second semiconductor structure.

FIG. 4b shows a schematic top view of the cavity structure 410 after the growth of a first semiconductor structure 441 and a second semiconductor structure 442. In the beginning of the growth process a common semiconductor structure 440 has been grown from the common seed surface. Then during the further growth the common semiconductor structure 440 is separated by the separation structure 451 and the first semiconductor structure 441 and the second semiconductor structure 442 is grown along the separation structure 451. Finally, in the merging area 453, the first and the second growth front of the first semiconductor structure 441 and the second semiconductor structure 442 have been merged. This has created a defined dislocation region 402 at a border area 401.

Figure 5A:
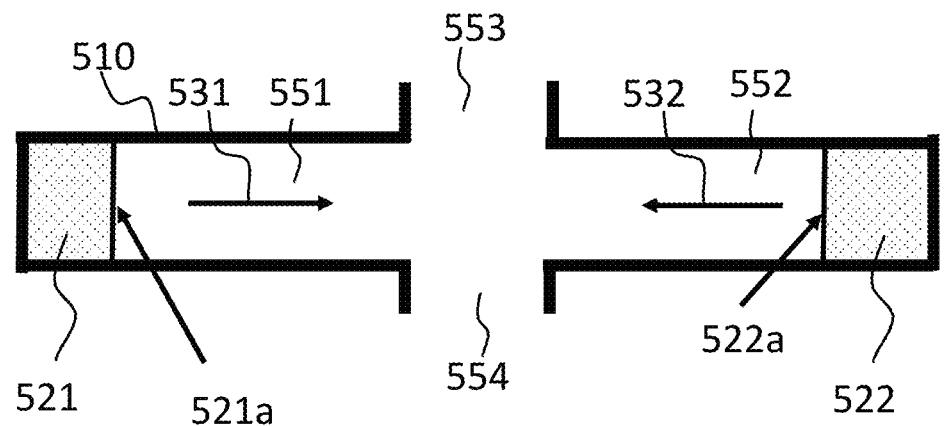
FIG. 5a and FIG. 5b show successive stages of a method for fabrication of semiconductor devices according to embodiments of the invention.
Figure 5B:
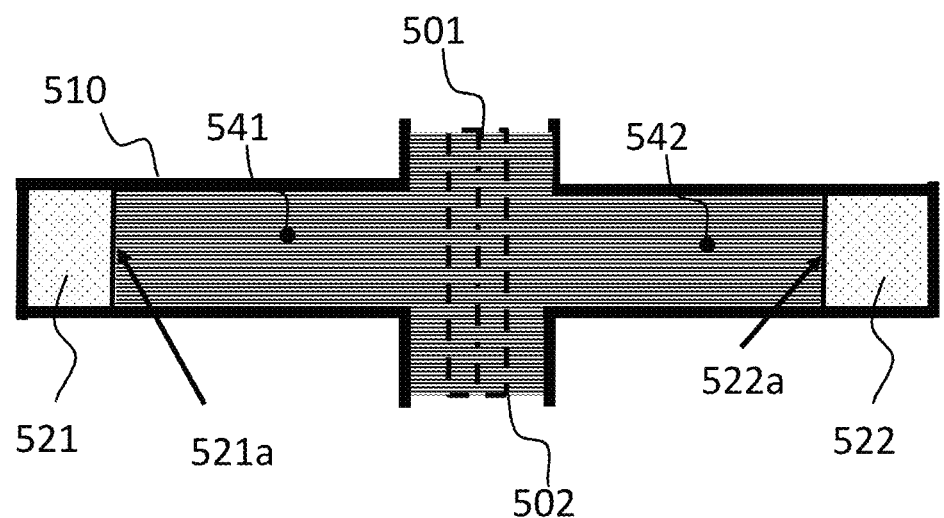

FIG. 5a and FIG. 5b show successive stages of a method for fabrication of semiconductor devices according to embodiments of the invention.

FIG. 5a is a schematic top view of a cavity structure 510 that comprises a first growth path 531 extending in a first direction and a second growth path 532 extending in a second direction, wherein the second direction is opposite to the first direction. The cavity structure 510 comprises a first seed 521 with a first seed surface 521a and a second seed 522 with a second seed surface 522a. The first seed 521 and the second seed 522 are arranged opposite to each other in opposite arms 551 and 552 of the cavity structure 510. The cavity structure 510 comprises side arms 553 and 554 arranged in a central area of the cavity structure 510. The side arms may be used to supply the precursor material to the cavity structure 510.

FIG. 5b shows a schematic top view of the cavity structure 510 after the growth of a first semiconductor structure 541 and a second semiconductor structure 542. The first semiconductor structure 541 has been grown from the first seed surface 521a along the first growth path 531 and the second semiconductor structure 541 has been grown from the second seed surface 522a along the second growth path 532. Finally, the growth fronts of the first semiconductor structure 541 and the second semiconductor structure 542 have merged at a border area 501. This has created a defined dislocation region 502 at the border area 501.

Figure 6A:
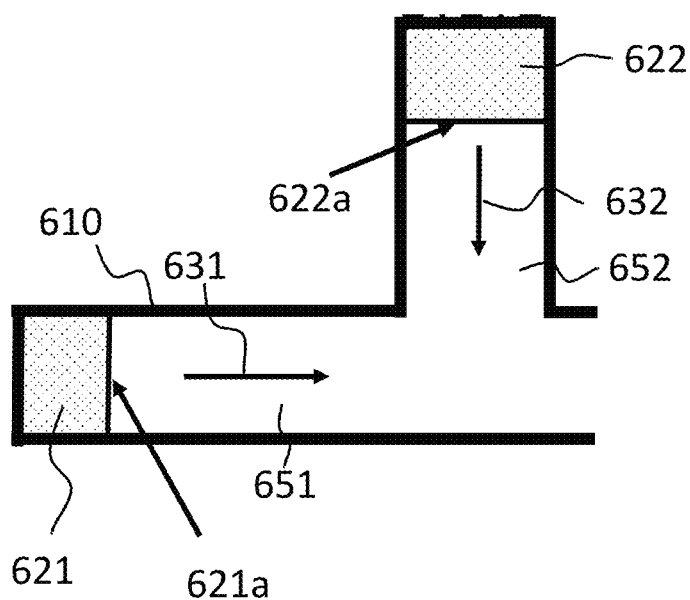
FIG. 6a and FIG. 6b show successive stages of a method for fabrication of semiconductor devices according to embodiments of the invention.
Figure 6B:
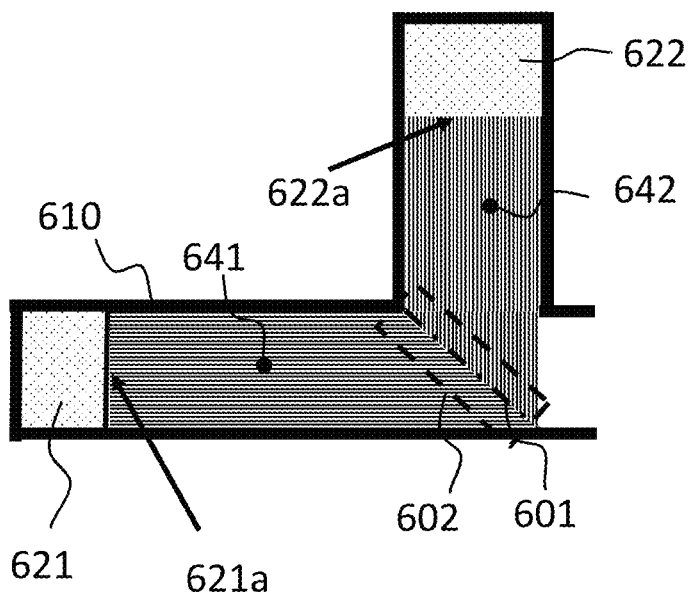

FIG. 6a and FIG. 6b show successive stages of a method for fabrication of semiconductor devices according to embodiments of the invention.

FIG. 6a is a schematic top view of a cavity structure 610 that comprises a first growth path 631 extending in a first direction and a second growth path 632 extending in a second direction, wherein the second direction is orthogonal to the first direction. The cavity structure 610 comprises a first seed 621 with a first seed surface 621a and a second seed 622 with a second seed surface 622a. The first seed 621 and the second seed 622 are arranged in arms 651 and 652 of the cavity structure 610.

FIG. 6b shows a schematic top view of the cavity structure 610 after the growth of a first semiconductor structure 641 and a second semiconductor structure 642. The first semiconductor structure 641 has been grown from the first seed surface 621a along the first growth path 631 and the second semiconductor structure 642 has been grown from the second seed surface 622a along the second growth path 632. Finally, the growth fronts of the first semiconductor structure 641 and the second semiconductor structure 642 have merged at a border area 601. This has created a defined dislocation region 602 at the border area 601.

Figure 7A:
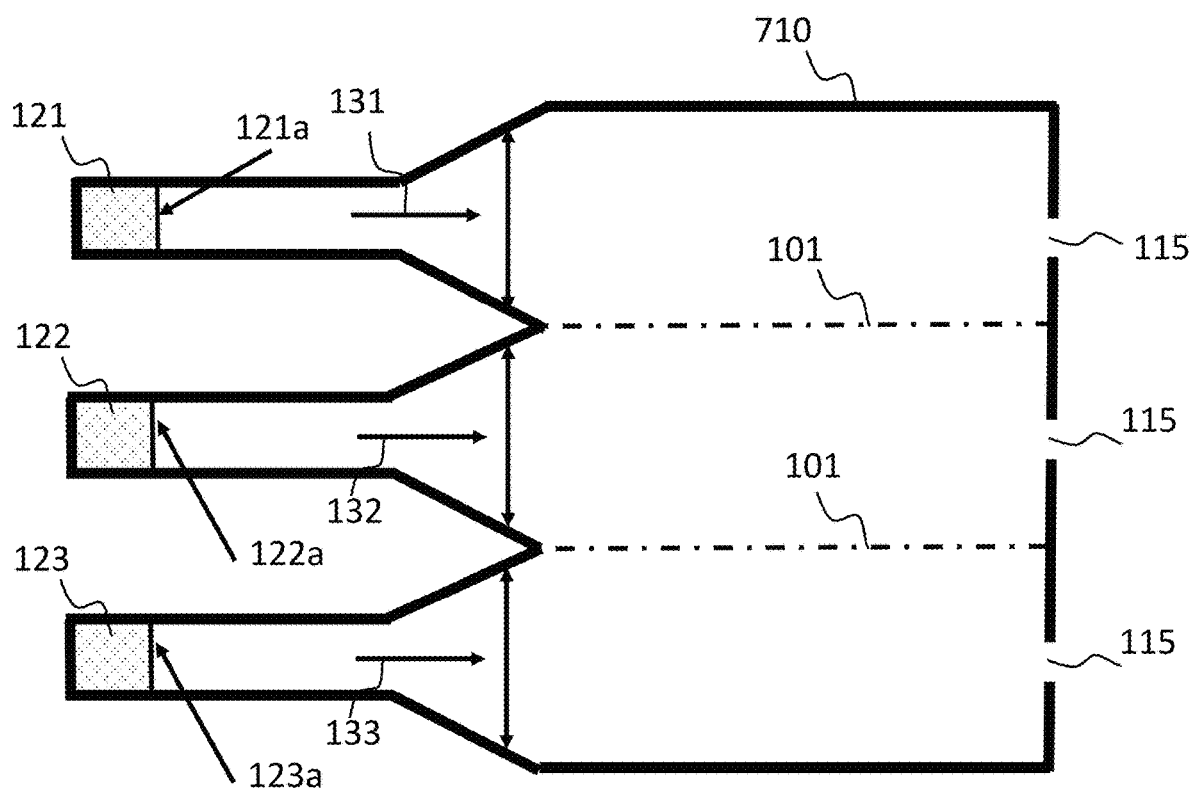
FIG. 7a and FIG. 7b show successive stages of a method for fabrication of semiconductor devices according to embodiments of the invention.
Figure 7B:
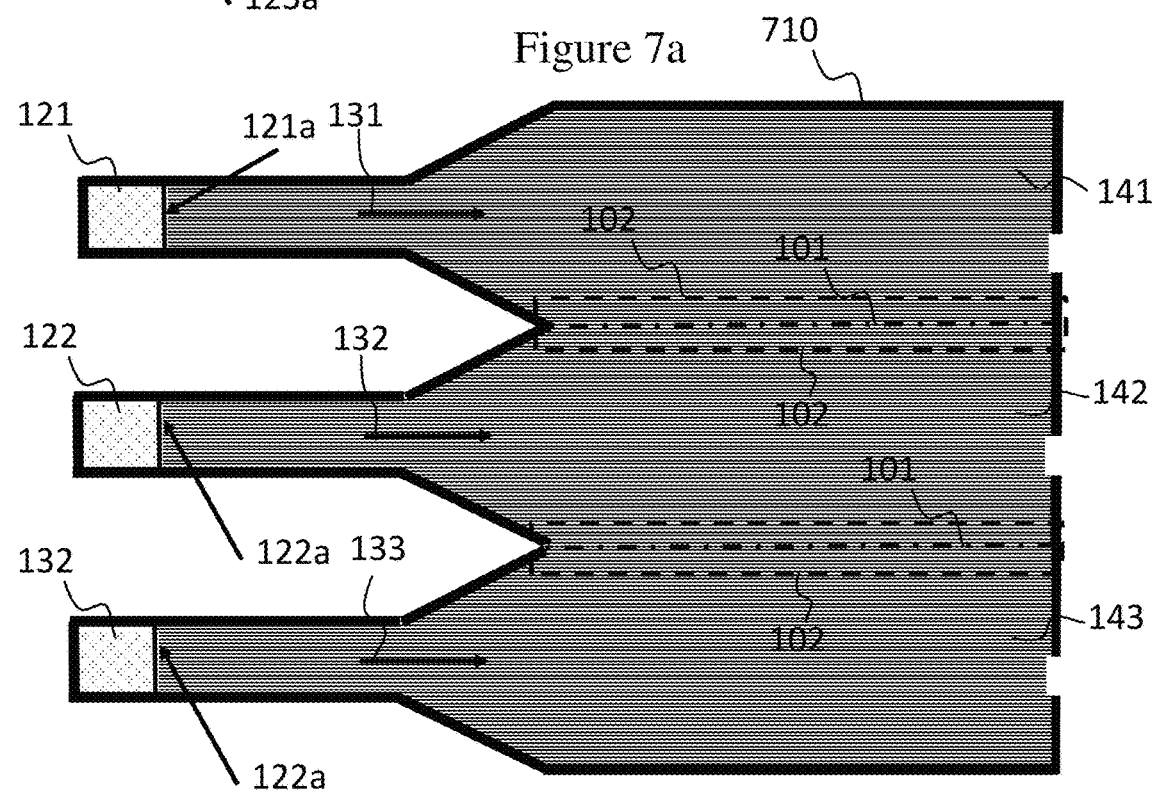

FIGS. 7a and 7b show successive stages of a method for fabrication of semiconductor devices according to embodiments of the invention.

FIG. 7a is a schematic top view of a cavity structure 710 that corresponds partly to the cavity structure 110 of FIG. 1a, but comprises in addition to the first growth path 131 and the second growth path 132 a third growth path 133 including a third seed 123 having a third seed surface 123a.

FIG. 7b shows the cavity structure 710 after the growth of the first semiconductor structure 141, the second semiconductor structure 142 and of a third semiconductor structure 143. The third semiconductor structure 143 has been grown along the third growth path 133. During the growth the second growth front of the second semiconductor structure 142 and the third growth front of the third semiconductor structure 143 have been merged at a border area 101 between the second and the third semiconductor structure. Thereby another defined dislocation region 102 has been grown.

It should be noted that the above described cavity structures are only exemplary examples and that by appropriate shaping of the cavity structure semiconductor structures may be fabricated with dislocation regions of a plurality of desired shapes.

Figure 8:
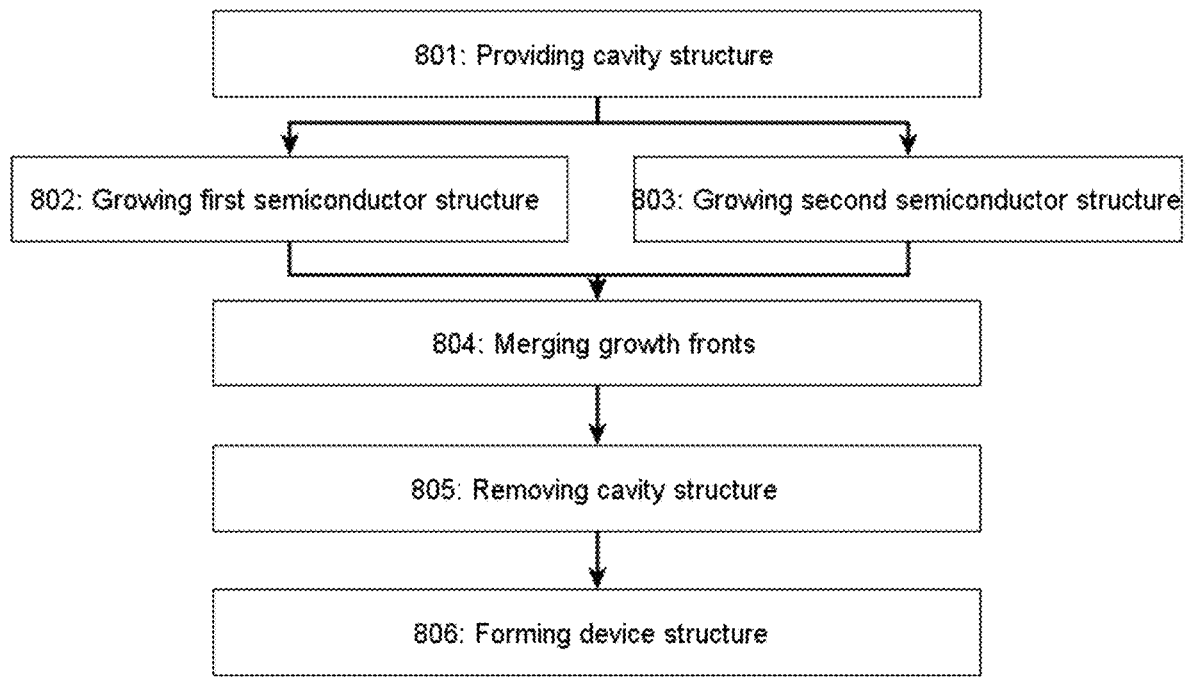
FIG. 8 is a flowchart of methods steps of a fabrication method embodying the invention in an embodiment.

FIG. 8 shows a flow chart of method steps for fabricating a semiconductor device according to embodiments of the invention.

At a step 801, a cavity structure is provided, e.g. the cavity structure 110 of FIG. 1a.

At a step 802, a first semiconductor structure is selectively grown from the first seed surface along the first growth path.

Concurrently, at a step 803, a second semiconductor structure is grown from the second seed surface along the second growth path.

At a step 804, the growth fronts of the first and the second semiconductor structures are merged at a border area between the first and the second semiconductor structure. Thereby, a defined dislocation region is grown at the border area.

At a step 805, the cavity structure is removed as desired, e.g. by etching.

At a step 806, a device structure is patterned as desired, e.g. by etching away undesired semiconductor or materials.

Finally, in a further step electrical contacts or a gate may be provided as desired.

A method for fabricating a semiconductor device on a substrate may be provided. The method can comprise steps of providing a substrate and providing a cavity structure on the substrate. The cavity structure can comprise one or more seed surfaces, a first growth path for the growth of a first semiconductor structure from one of the one or more seed surfaces and a second growth path for the growth of a second semiconductor structure from one of the one or more seed surfaces. The cavity structure can further comprise at least one opening for supplying precursor materials to the cavity structure. The method can further comprise steps of selectively growing the first semiconductor structure along the first growth path and selectively growing the second semiconductor structure along the second growth path. The first semiconductor structure can have a first growth front and the second semiconductor structure can have a second growth front. The method can comprise a further step of merging the first and the second growth front at a border area of the first and the second semiconductor structure. Thereby, a defined dislocation region can be grown at the border area. Related semiconductor devices obtainable by such a method can be provided.

While particular examples have been described above, numerous alternatives and modifications may be envisaged. E.g., various other compound semiconductors may be used in the above processes, and other dopant and etchant combinations may be used. The resulting semiconductor structures may be further processed if desired, e.g. via additional etching and/or growth stages to produce more complex structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device on a substrate, the method comprising:

providing a substrate;

providing a cavity structure on the substrate, the cavity structure comprising one or more seed surfaces;
a first growth path for the growth of a first semiconductor structure from one of the one or more seed surfaces;
a second growth path for the growth of a second semiconductor structure from one of the one or more seed surfaces; and
at least one opening for supplying precursor materials to the cavity structure;

selectively growing the first semiconductor structure along the first growth path, the first semiconductor structure having a first growth front;

selectively growing the second semiconductor structure along the second growth path, the second semiconductor structure having a second growth front; and merging the first and the second growth front at a border area of the first and the second semiconductor structure, thereby growing a defined dislocation region at the border area;

wherein the cavity structure further comprises:
a first tapered edge portion adapted to extend the first growth path to the border area; and
a second tapered edge portion adapted to extend the second growth path to the border area; wherein
the first tapered edge portion and the second tapered edge portion converge at the dislocation region.

2. A method as claimed in claim 1, wherein the one or more seed surfaces comprise a first seed surface and a second seed surface, the second seed surface being spaced apart from the first seed surface, the method comprising selectively growing from the first seed surface the first semiconductor structure; and selectively growing from the second seed surface the second semiconductor structure.

3. A method as claimed in claim 1, wherein the one or more seed surfaces comprise a common seed surface for the first semiconductor structure and the second semiconductor structure;

the cavity structure comprises a separation structure arranged in a separation area between the first growth path and the second growth path; and the cavity structure comprises a merging area for merging the growth fronts of the first and the second semiconductor structure; the method comprising selectively growing from the common seed surface a common semiconductor structure;

selectively growing the first semiconductor structure and the second semiconductor structure along the separation structure, thereby separating the common semiconductor structure by the separation structure; and merging the first and the second growth front in the merging area of the cavity structure.

4. A method as claimed in claim 1, wherein the defined dislocation region establishes a dislocation plane.

5. A method as claimed in claim 1, wherein the dislocation region comprises grain boundaries.

6. A method as claimed in claim 1, wherein the one or more seed surfaces are arranged with a predefined angle towards each other.

7. A method as claimed in claim 1, wherein the cavity structure comprises a third growth path for the growth of a third semiconductor structure from one of the one or more seed surfaces; and the method further comprises selectively growing the third semiconductor structure along the third growth path, the third semiconductor structure having a third growth front; and merging the second and the third growth front at a border area of the second and the third semiconductor structure, thereby growing a defined dislocation region at the border area of the second and the third semiconductor structure.

8. A method as claimed in claim 1, wherein the selective growing of the first semiconductor structure and the second semiconductor structure is performed by selective epitaxial growth.

9. A method as claimed in claim 8, wherein the selective growing of the first semiconductor structure and the second semiconductor structure is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) and hydride vapor phase epitaxy.

10. A method as claimed in claim 1, wherein the first semiconductor structure and the second semiconductor structures comprise a compound semiconductor material.

11. A method as claimed in claim 10, wherein the first semiconductor structure and the second semiconductor structure comprise a group III-V compound material or a group II-VI compound material.

12. A method as claimed in claim 1, wherein the one or more seed surfaces have an area of order $10^4$ nm$^2$ or less.

13. A method as claimed in claim 1, wherein the one or more seed surfaces have a monocrystalline semiconductor surface.

14. A method as claimed in claim 1, wherein the substrate is used as one of the one or more seed surfaces.

15. A method as claimed in claim 1, comprising, after growing the first and the second semiconductor structure, removing the cavity structure.

16. A method as claimed in claim 1, wherein the first growth path and the second growth path extend laterally over the substrate.

17. A method as claimed in claim 1, wherein the first growth path and the second growth path extend vertically to the substrate.

* * * * *